(12) United States Patent
Tsorng et al.

(10) Patent No.: US 12,232,285 B2
(45) Date of Patent: Feb. 18, 2025

(54) MOUNTING ASSEMBLY WITH NESTED BRACKETS

(71) Applicant: Quanta Computer Inc., Taoyuan (TW)

(72) Inventors: Yaw-Tzorng Tsorng, Taoyuan (TW); Ming-Lung Wang, Taoyuan (TW); Nan-Chun Wu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 81 days.

(21) Appl. No.: 18/171,888

(22) Filed: Feb. 21, 2023

(65) Prior Publication Data

US 2024/0284618 A1 Aug. 22, 2024

(51) Int. Cl.
*H05K 5/02* (2006.01)
*F16M 13/02* (2006.01)

(52) U.S. Cl.
CPC .......... *H05K 5/0221* (2013.01); *F16M 13/02* (2013.01)

(58) Field of Classification Search
CPC .............................. H05K 5/0221; F16M 13/02
USPC .................................................... 248/220.22
See application file for complete search history.

(56) References Cited

U.S. PATENT DOCUMENTS

| | | | | |
|---|---|---|---|---|
| 368,367 A | * | 8/1887 | Name not available | F16M 13/02 248/287.1 |
| 3,098,542 A | * | 7/1963 | Wallace | B66F 7/18 187/206 |
| 3,363,724 A | * | 1/1968 | Quatkemeyer | B66F 7/18 187/206 |
| 5,535,972 A | * | 7/1996 | Fallago | A47B 96/061 248/245 |
| 6,241,210 B1 | * | 6/2001 | Brindisi | A47G 1/1613 248/496 |
| 6,409,419 B1 | * | 6/2002 | Hernandez | E01F 13/04 404/6 |
| 6,783,369 B2 | * | 8/2004 | Zhang | H05K 13/0409 439/135 |
| 7,066,435 B2 | * | 6/2006 | Oddsen, Jr. | F16M 11/24 248/220.31 |

(Continued)

FOREIGN PATENT DOCUMENTS

| CN | 108012484 A | * | 5/2018 | ........... H05K 5/0217 |
|---|---|---|---|---|
| CN | 114508682 A | * | 5/2022 | ............. H04N 23/50 |

(Continued)

*Primary Examiner* — Taylor Morris
(74) *Attorney, Agent, or Firm* — NIXON PEABODY LLP (57) ABSTRACT

A bracket assembly for installation of equipment is disclosed. The bracket assembly includes a female bracket with a receptacle and a recess in a wall of the receptacle; and a male bracket with a locking mechanism and a housing adapted to fit in the receptacle. The housing has walls defining a cavity. The locking mechanism has a latching member, a sliding member, and a shaft. The latching member is pivotable between an unlocked position and a locked position. When in the locked position, a first end of protrudes from the housing and rests in the recess. The sliding member moves along a vertical axis between two positions. When in a lower position, the sliding member presses a second end of the latching member to cause the first end to pivot into the unlocked position. The shaft extends along the vertical axis and is configured to manipulate the sliding member.

21 Claims, 6 Drawing Sheets

(56) References Cited

U.S. PATENT DOCUMENTS

| | | | | |
|---|---|---|---|---|
| 7,175,313 B2 * | 2/2007 | Bednara | | H05K 5/061 |
| | | | | 361/674 |
| 7,219,768 B2 * | 5/2007 | Climenhaga | | B66F 7/18 |
| | | | | 187/203 |
| RE43,696 E * | 10/2012 | Graham | | F16M 11/18 |
| | | | | 248/495 |
| 8,576,562 B2 * | 11/2013 | Schwager | | E05C 19/163 |
| | | | | 361/679.55 |
| 8,708,595 B2 * | 4/2014 | Tseng | | F16B 5/0092 |
| | | | | 403/325 |
| 9,326,401 B2 * | 4/2016 | Duran | | H05K 5/0086 |
| 9,404,615 B1 * | 8/2016 | Gonzalez | | H05K 5/0208 |
| 9,521,769 B2 * | 12/2016 | Howell | | H05K 7/1488 |
| 9,801,296 B1 * | 10/2017 | Wu | | H05K 5/0013 |
| 9,851,745 B2 * | 12/2017 | Lev | | G06F 1/1679 |
| 9,897,250 B1 * | 2/2018 | Sivertsen | | F16M 13/02 |
| 9,930,809 B2 * | 3/2018 | Schoerner | | H05K 7/2039 |
| 9,982,832 B1 * | 5/2018 | Nicolas | | F16M 11/2014 |
| 10,153,113 B2 * | 12/2018 | Richardson | | H05K 5/0004 |
| 10,342,147 B2 * | 7/2019 | Wu | | H05K 5/0295 |
| 11,971,135 B2 * | 4/2024 | Tsorng | | F16M 13/022 |
| 12,085,223 B1 * | 9/2024 | Ozkan | | A47B 96/063 |
| 2006/0261226 A1 * | 11/2006 | Petrick | | F16M 13/02 |
| | | | | 248/274.1 |
| 2016/0325928 A1 * | 11/2016 | Lepek | | B65G 1/0471 |
| 2021/0282282 A1 * | 9/2021 | Scott | | H05K 5/0221 |
| 2022/0272841 A1 * | 8/2022 | Wrobel | | H05K 5/0221 |

FOREIGN PATENT DOCUMENTS

| | | | | |
|---|---|---|---|---|
| EP | 2699066 A1 * | 2/2014 | | H05K 5/0204 |
| WO | WO-2015122898 A1 * | 8/2015 | | G11B 33/022 |
| WO | WO-2015161761 A1 * | 10/2015 | | A47B 81/06 |
| WO | WO-2015183337 A1 * | 12/2015 | | G11C 14/0018 |
| WO | WO-2018147921 A1 * | 8/2018 | | E05B 65/44 |
| WO | WO-2021064158 A1 * | 4/2021 | | E05B 65/52 |

* cited by examiner

MOUNTING ASSEMBLY WITH NESTED BRACKETS

FIELD OF THE INVENTION

The present invention relates generally to an equipment mounting assembly, and more specifically, to a nested mounting assembly with a male bracket adapted for securely nesting inside a female bracket.

BACKGROUND OF THE INVENTION

Conventional mounting kits for equipment such as 5G mobile network components typically require fixing the equipment to a mounting surface using screws. When attempting to mount equipment using such mounting kits at high altitude (e.g., atop poles or elevated structures) as is typically required for 5G components, having an operator manipulate a screw and screwdriver with both hands could be inconvenient and possibly even dangerous for both the operator and passers-by, who could be injured by falling objects such as a screwdriver that slips out of the operator's hand.

In view of the disadvantages of conventional mounting kits, what is needed is a mounting assembly that allows the operator to install a piece of equipment easily and quickly without or with minimal use of a screwdriver or other tools. Further, another need is for a mounting bracket able to secure the equipment to the mounting surface so that movement or rotation of the equipment in any direction is restricted.

SUMMARY OF THE INVENTION

In view of the foregoing disadvantages with conventional mounting kits, the present disclosure describes a nested mounting assembly having a male bracket adapted for fitting inside a female bracket. The disclosed bracket assembly has an automatic locking mechanism which enables an operator to install a piece of equipment to from a mounting surface quickly and easily, and with minimal or without use of tools to complete the installation. Conversely, the disclosed bracket assembly also allows the operator to more easily uninstall the piece of equipment by using a tool from a more easily accessible angle, such as from the top of the disclosed bracket assembly. Another advantage of the mounting assembly disclosed herein is that the mounting assembly enables equipment to be installed vertically. As such, equipment can be installed in confined spaces with limited operating space on the sides or have multiple pieces of equipment installed side-by-side and in close proximity to one another.

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a male bracket for engaging a female bracket that includes a receptacle with a recess formed in a wall of the receptacle. The male bracket includes a housing and a locking mechanism. The housing has at least two walls defining a cavity and the housing is adapted to fit in the receptacle of the female bracket at least partially. The locking mechanism includes a latching member, a sliding member, and a shaft. The latching member is pivotably fixed in the cavity to rotate about a pivot axis. The latching member has a first end and a second end distally located from the first end. The first end is pivotable between an unlocked position and a locked position. In the unlocked position, the first end is retracted inside the housing. In the locked position, the first end protrudes from the housing and rest in the recess of the female bracket. The sliding member is movable along a vertical axis between an upper position and a lower position. The sliding member has a first surface configured to press against the second end of the latching member when the sliding member is in the lower position to cause the first end of the latching member to pivot into the unlocked position. The shaft extends along the vertical axis and is configured to manipulate movement of the sliding member between the upper position and the lower position.

According to another aspect of the male bracket described above, the latching member has a center of mass offset from the pivot axis so that the first end is biased to rotate towards the locked position.

According to another aspect of the male bracket described above, the sliding member further includes a bore hole coinciding with the vertical axis. The bore hole has a threaded interior surface installed around a threaded midsection of the shaft, whereby rotation of the shaft adjusts position of the sliding member.

According to another aspect of the male bracket described above, the shaft further includes a first shaft end having a bolt head attached thereto.

According to another aspect of the male bracket described above, the shaft further includes a second shaft end distal to the first shaft end, the second shaft end having a screw buckle attached thereto. The bolt head and the screw buckle capture the shaft between a top cover and a bottom cover of the housing.

According to another aspect of the male bracket described above, the sliding member further includes a second surface positioned below the first surface at an angle relative to the first surface. The second surface is configured to interface with the second end of the latching member when the sliding member is in the upper position, thereby retaining the first end of the latching member in the locked position.

According to another aspect of the male bracket described above, the angle of the second surface relative to the first surface is about 10 degrees to about 20 degrees.

According to another aspect of the male bracket described above, the housing further includes one or more mounting points on an exterior surface of the housing, the one or more mounting points being adapted for attachment to a mounting surface.

According to another aspect of the male bracket described above, the latching member is an elongated member having a pin traversing a midsection of the elongated member along the pivot axis, the midsection being situated between the first end and the second end of the latching member.

According to another aspect of the male bracket described above, the housing further includes one or more protuberances configured to engage one or more channels in the receptacle of the female bracket to retain the male bracket in the receptacle.

According to other aspects of the present disclosure, a mounting assembly for installation of equipment includes a female bracket and a male bracket. The female bracket includes a receptacle that has a base, and two sidewalls and a backwall extending from the base. The backwall has an interior surface with a recess formed thereon. The male bracket includes a housing and a locking mechanism. The housing has at least two walls defining a cavity and the housing is adapted to fit in the receptacle of the female bracket at least partially. The locking mechanism includes a latching member, a sliding member, and a shaft. The latching member is pivotably fixed in the cavity to rotate about a pivot axis. The latching member has a first end and a second end distally located from the first end. The first end is pivotable between an unlocked position and a locked position. In the unlocked position, the first end is retracted inside the housing. In the locked position, the first end protrudes from the housing and rest in the recess of the female bracket. The sliding member is movable along a vertical axis between an upper position and a lower position. The sliding member has a first surface configured to press against the second end of the latching member when the sliding member is in the lower position to cause the first end of the latching member to pivot into the unlocked position. The shaft extends along the vertical axis and is configured to manipulate movement of the sliding member between the upper position and the lower position.

According to another aspect of the mounting assembly described above, the latching member has a center of mass offset from the pivot axis so that the first end is biased to rotate towards the locked position.

According to another aspect of the mounting assembly described above, the sliding member further includes a bore hole coinciding with the vertical axis. The bore hole has a threaded interior surface installed around a threaded midsection of the shaft, whereby rotation of the shaft adjusts position of the sliding member.

According to another aspect of the mounting assembly described above, the shaft further includes a first shaft end having a bolt head attached thereto.

According to another aspect of the mounting assembly described above, the shaft further includes a second shaft end distal to the first shaft end, the second shaft end having a screw buckle attached thereto. The bolt head and the screw buckle capture the shaft between a top cover and a bottom cover of the housing.

According to another aspect of the mounting assembly described above, the sliding member further includes a second surface positioned below the first surface at an angle relative to the first surface. The second surface is configured to interface with the second end of the latching member when the sliding member is in the upper position, thereby retaining the first end of the latching member in the locked position.

According to another aspect of the mounting assembly described above, the angle of the second surface relative to the first surface is about 10 degrees to about 20 degrees.

According to another aspect of the mounting assembly described above, the housing further includes one or more mounting points on an exterior surface of the housing, the one or more mounting points being adapted for attachment to a mounting surface.

According to another aspect of the mounting assembly described above, the latching member is an elongated member having a pin traversing a midsection of the elongated member along the pivot axis, the midsection being situated between the first end and the second end of the latching member.

According to other aspects of the present disclosure, a piece of electronic equipment includes an electronic device that has a mounting surface and a male bracket for engaging a female bracket that includes a receptacle with a recess formed in a wall of the receptacle. The male bracket includes a housing and a locking mechanism. The housing has at least two walls defining a cavity and the housing is adapted to fit in the receptacle of the female bracket at least partially. The locking mechanism includes a latching member, a sliding member, and a shaft. The latching member is pivotably fixed in the cavity to rotate about a pivot axis. The latching member has a first end and a second end distally located from the first end. The first end is pivotable between an unlocked position and a locked position. In the unlocked position, the first end is retracted inside the housing. In the locked position, the first end protrudes from the housing and rest in the recess of the female bracket. The sliding member is movable along a vertical axis between an upper position and a lower position. The sliding member has a first surface configured to press against the second end of the latching member when the sliding member is in the lower position to cause the first end of the latching member to pivot into the unlocked position. The shaft extends along the vertical axis and is configured to manipulate movement of the sliding member between the upper position and the lower position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Generally, an embodiment of the present invention is directed to a nested bracket assembly for mounting equipment to a mounting surface. The disclosed bracket assembly includes a female bracket and a male bracket adapted to nest in the female bracket. Each of the female bracket and the male bracket is adapted for fixedly attaching to a surface (e.g., the surface of a piece of equipment, a wall, or a pole). Furthermore, the bracket assembly includes an automatic locking mechanism which requires minimal use of tools to complete the installation.

Figure 1:
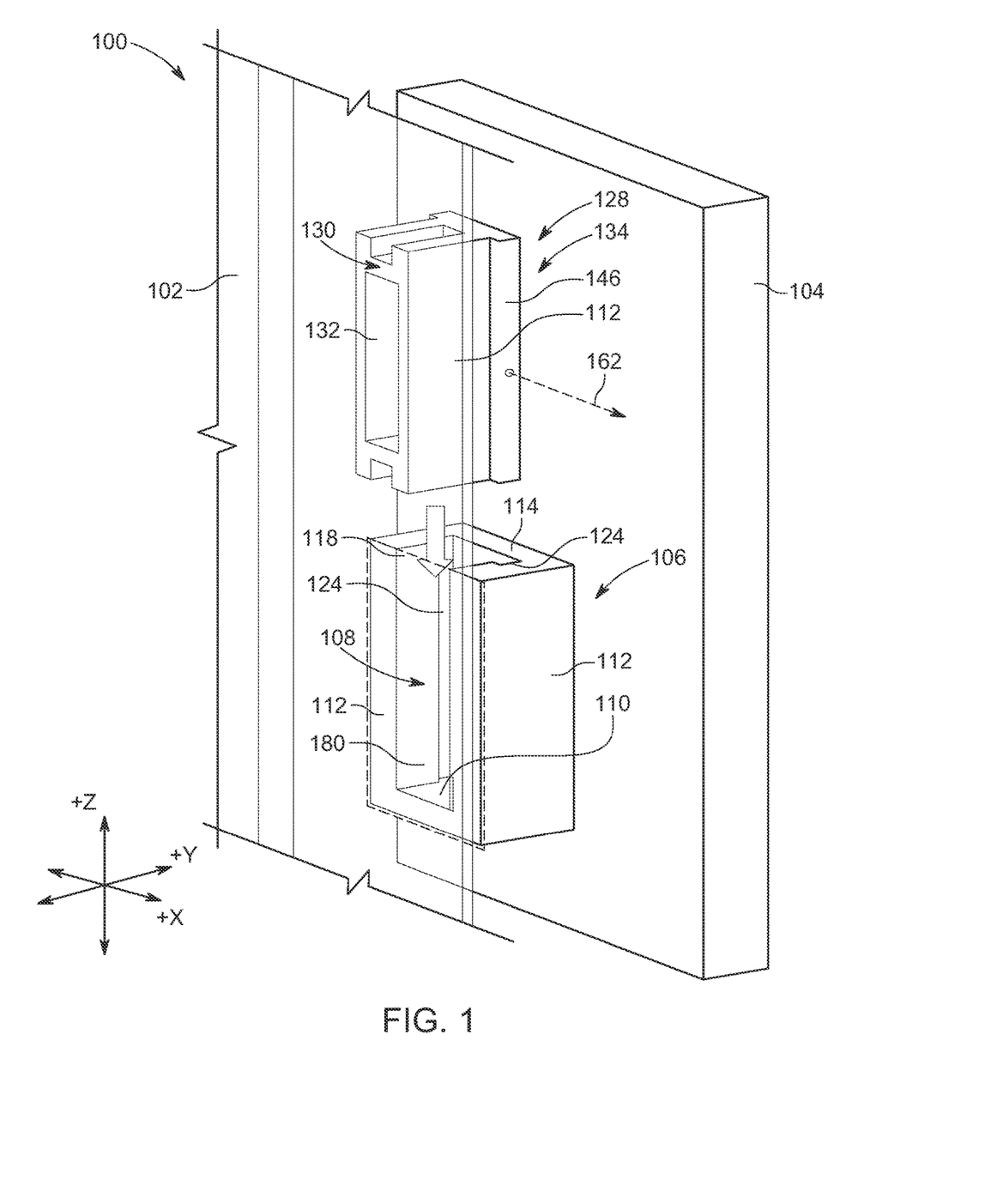
FIG. 1 is a perspective view showing a female bracket and a male bracket of an example bracket assembly, according to certain aspects of the present disclosure.

FIG. 1 illustrates a bracket assembly 100 for installation of equipment including a female bracket 106 and a male bracket 128. Each of the female bracket 106 and the male bracket 128 is fixed to a surface. Here, for example, the female bracket 106 is fixed to a mounting surface 104, such as a wall, while the male bracket 128 is fixed to a surface of a piece of equipment 102. According to some embodiments, the female bracket 106 includes a receptacle 108. The receptacle 108 has a base 110, and a backwall 114 and two sidewalls 112 extending upward from the base 110. According to some embodiments, the receptacle 108 has sidewalls 112 and the backwall 114 on three sides, while an unwalled or partially walled fourth side 118 is adapted for receiving the male bracket 128. The male bracket 128 has a housing 130 adapted to fit inside the receptacle 108. The housing 130 has two or more walls 132 that define a cavity 136, which houses an automatic locking mechanism 150 for the bracket assembly 100. According to some embodiments, the housing 130 has the two sidewalls 132 and an unwalled or partially walled third side 134 adapted for a latching member 152 to extend from the housing 130. By positioning the male bracket 128 opposite the female bracket 106 and seating the male bracket 128 in the receptacle 108 of the female bracket 106, the locking mechanism 150 (shown in FIGS. 2A and 2B) of the male bracket 128 engages a recess 120 (shown in FIGS. 2A and 2B) in the female bracket 106 to lock the male bracket 128 in place. This secures the male bracket 128 in a vertical direction (i.e., along a direction parallel to the z axis). As such, the equipment 102 that the male bracket 128 is attached to is securely fixed to the mounting surface 104 that the female bracket 106 is attached to. The locking mechanism 150 of the male bracket 128 and the recess 120 of the female bracket 106 are described in detail below in relation to FIGS. 2A and 2B. According to some embodiments, the male bracket 128 further includes one or more protuberances 146 attached to the housing 130. The protuberances 146 are adapted for sliding into one or more channels 124 positioned in the receptacle 108. The protuberances 146 engage (e.g., fit inside) the channels 124 to restrict rotational and lateral movement of the male bracket 128. For example, such protuberances 146 can include one or more vertical ridges along an outer surface of one or both sidewalls 112 of the housing 130. The channels 124 can be shaped to match the protuberances 146 and may be positioned correspondingly along an inner surface 180 of the sidewalls 112 of the female bracket 106 to receive the protuberances 146. Alternatively, placement of the one or more protuberances 146 and one or more channels 124 can be reversed so that the housing 130 has the channels 124 and the female bracket 106 has the protuberances 146. Other alternative designs for restricting rotational and lateral movements of the male bracket 128 inside the receptacle 108 of the female bracket 106 would be apparent to a person of ordinary skill in the art.

Figure 2A:
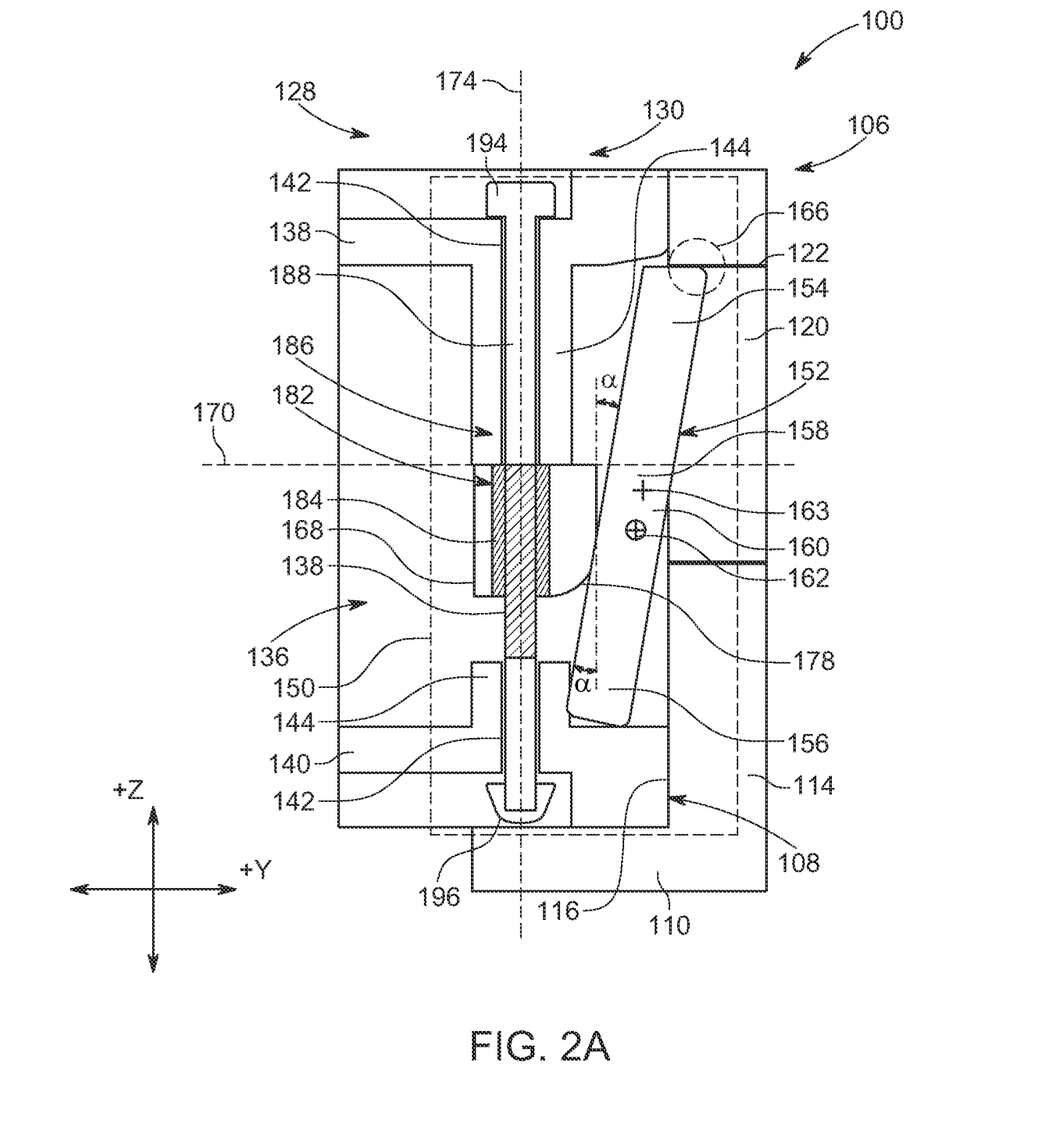
FIG. 2A is a side cross-sectional view of the bracket assembly of FIG. 1 with the latching member in the locked position, according to certain aspects of the present disclosure.
Figure 2B:
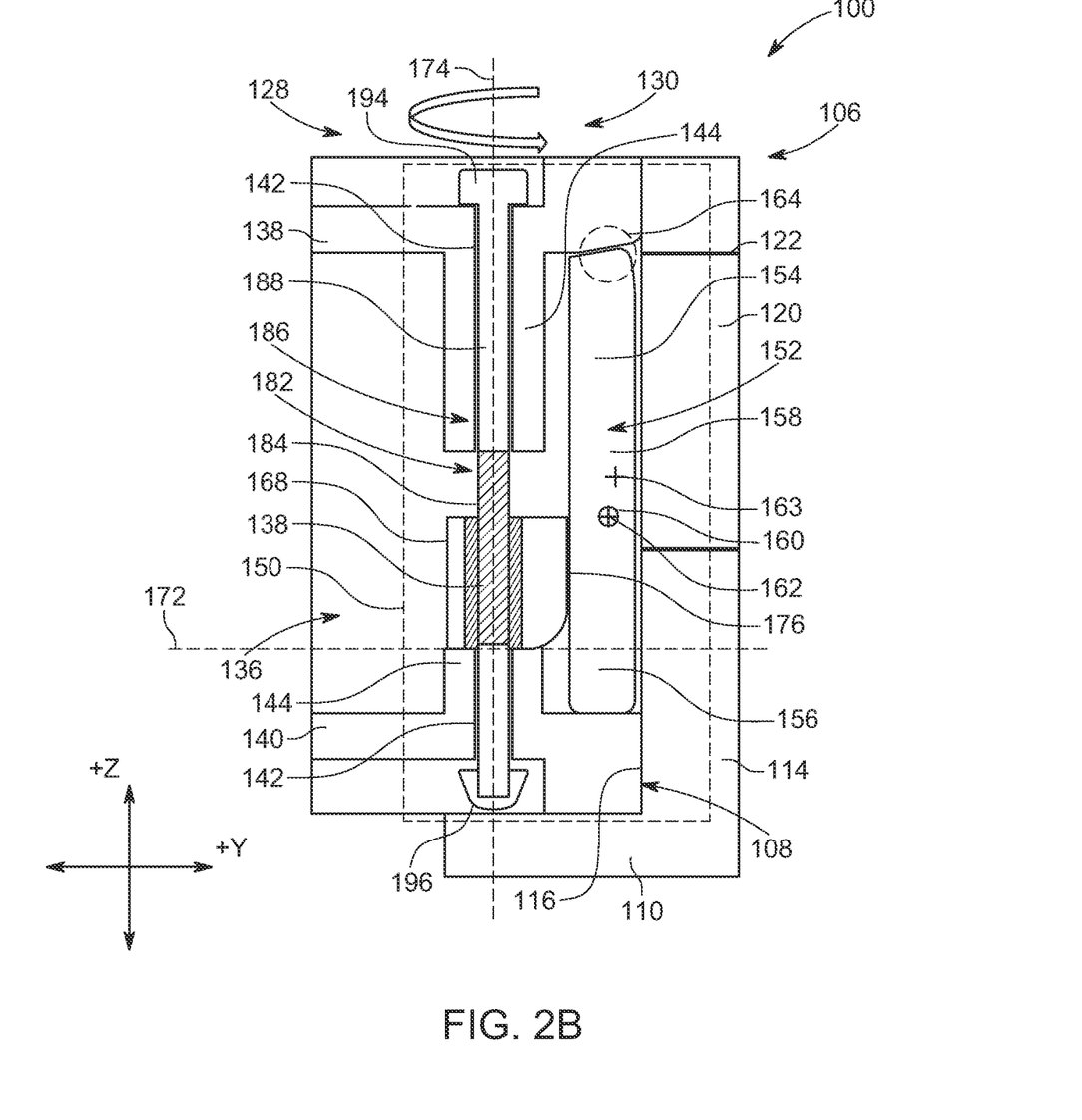
FIG. 2B is a side cross-sectional view of the bracket assembly of FIG. 1 with the latching member in the unlocked position, according to certain aspects of the present disclosure.

Referring to FIGS. 2A and 2B in general, a side cross-sectional view of the bracket assembly 100 shows an exemplary locking mechanism 150 and its operations, according to some embodiments of the present disclosure. The male bracket 128 is shown nested within the female bracket 106. As previously described, the female bracket 106 includes the receptacle 108. The receptacle 108 includes the base 110 having two sidewalls 112 and the backwall 114 that extend from the base 110 (shown in FIG. 1). The backwall 114 has an interior surface 116 with a recess 120 formed thereon. The recess 120 is adapted for engaging the locking mechanism 150 of the male bracket 128 when the brackets 106 and 128 are assembled. As shown here, the male bracket 128 includes a housing 130 having two or more sidewalls 132 (shown in FIG. 1). As previously described, of the sidewalls 132 define the cavity 136 within the housing 130. The locking mechanism 150 for engaging the recess 120 is positioned at least partially inside the cavity 136. According to some embodiments, the locking mechanism 150 includes a latching member 152, a sliding member 168, and a shaft 186.

The latching member 152 has a first end 154, a second end 156 distally located from the first end 154, and a midsection 158 configured between the first end 154 and the second end 156. According to some embodiments, the latching member 152 is an elongated member with the first end 154 extending upward (i.e., in a +z direction) and the second end 156 extending downward (i.e., in a −z direction). The latching member 152 is pivotably fixed in the cavity 136 about a pivot axis 162. For example, the latching member 152 can be pivotably fixed via a pin 160 with each pin end secured to one of the sidewalls 132 (shown in FIG. 1) of the housing 130. The pin 160 transverses the midsection 158 of the latching member 152 along the pivot axis 162. The latching member 152 rotates about the pivot axis 162 such that the first end 154 is pivotable between an unlocked position 164 and a locked position 166. As shown in FIG. 2A, when the first end 154 is in the locked position 166, the latching member 152 is angled forward so that the first end 154 protrudes from the housing 130 and rests in the recess 120 of the female bracket 106. Specifically, when the first end 154 is in the locked position 166, the first end 154 engages a ceiling 122 of the recess 120 to restrict vertical movement of the male bracket 128. In other words, the male bracket 128 is captured between the base 110 of the receptacle 108 and the ceiling 122 of the recess 120, thereby retaining the male bracket 128 in the female bracket 106 along the vertical direction (i.e., along the z axis). As shown in FIG. 2B, when the first end 154 is in the unlocked position 164, the latching member 152 is substantially vertical (i.e., parallel to the z axis), causing the first end 154 to retract into the cavity 136, thereby freeing the male bracket 128 to move in the vertical direction. This allows the male bracket 128 to be taken out of the receptacle 108.

According to some embodiments, the latching member 152 has a center of mass 163 offset from the pivot axis 162 so that the first end 154 is biased to rotate towards the locked position 166 (i.e., rotate in a +y direction) when the male bracket 128 is installed in the female bracket 106. For example, the center of mass 163 could be placed at a point along the latching member 152 between the pivot axis 162 and the first end 154, with the center of mass 163 further offset in the +y direction than the pivot axis 162. As such, when the male bracket 128 is positioned upright (i.e., the first end 154 of the latching member 152 is oriented in the +z direction), gravity causes the latching member 152 to naturally rotate in the +y direction, thereby causing the first end 154 to move into the locked position 166.

The sliding member 168 is movable along a vertical axis 174 between an upper position 170 and a lower position 172. The sliding member 168 is positioned adjacent to the latching member 152 and configured to press against the second end 156 of the latching member 152 when the sliding member 168 is in the lower position 172. Pressing the sliding member 168 against the latching member 152 forces the first end 154 of the latching member 152 to rotate in the −y direction into the unlocked position 164. Conversely, when the sliding member 168 moves into the upper position 170, the first end 154 of the latching member 152 rotates in the ty direction into the locked position 166. As described above, the rotation of the first end 154 of the latching member 152 into the locked position 166 is achieved by offsetting the center of mass 163 of the latching member 152 from the pivot axis 162 so that the latching member 152 is biased to rotate toward the locked position 166. As such, by moving the sliding member 168 between the upper position 170 and the lower position 172, the first end 154 of the latching member 152 can be toggled between the unlocked position 164 and the locked position 166.

According to some embodiments, the sliding member 168 includes a first surface 176 configured to interface with the second end 156 of the latching member 152 when the sliding member 168 is in the lower position 172, as shown in FIG. 2B. According to some embodiments, the first surface 176 is substantially vertical. According to some embodiments, the sliding member 168 further includes a second surface 178 configured below the first surface 176. The second surface 178 is configured to interface with the second end 156 when the sliding member 168 is in the upper position 170, as shown in FIG. 2A. The second surface 178 functions as a stop member to ensure that rotation of the first end 154 of the latching member 152 does not exceed a predetermined angle. According to some embodiments, the second surface 178 is arranged at an angle α relative to the first surface 176. When the second end 156 of the latching member 152 is interfaced with the second surface 178, the first end 154 is rotated by approximately angle α. According to some embodiments, the angle α is between about 10 degrees to about 20 degrees. According to an alternative embodiment, the second surface 178 has a chamfered surface.

The movement of the sliding member 168 can be controlled by the shaft 186, which can be a bolt. The shaft 186 extends along the vertical axis 174 and is rotatably fixed between a top cover 138 and a bottom cover 140 of the housing 130. According to some embodiments, the shaft 186 has a threaded midsection 198 and the sliding member 168 further includes a bore hole 182 configured to receive the shaft 186. The bore hole 182 coincides with the vertical axis 174 and the shaft 186. A threaded interior surface 184 of the bore hole 182 is installed around the threaded midsection 198 of the shaft 186. Rotation of the shaft 186 about the vertical axis 174 turns the threaded midsection 198 of the shaft 186 inside the bore hole 182 of the sliding member 168, causing the sliding member 168 to move between the upper position 170 and the lower position 172 depending on the direction that the shaft 186 is rotated.

According to some embodiments, the shaft 186 is captured between a top cover 138 and a bottom cover 140 of the housing 130. Each of the top cover 138 and the bottom cover 140 has a hole 142 aligned with the vertical axis 174 for receiving the shaft 186. According to some embodiments, the shaft 186 can include a bolt 188 with a bolt head 194 attached to one end of the shaft 186 and a screw buckle 196 attached to the other end of the shaft 186. The bolt head 194 and the screw buckle 196 capture the shaft 186 between the top cover 138 and the bottom cover 140, but at the same time allow the shaft 186 to rotate. According to some embodiments, the bolt head 194 is configured to engage with one or more types of screwdrivers or wrenches. For example, the bolt head 194 can have a slot or other indentation pattern adapted to receive one or more types of screwdrivers or a shape such as a hexagon adapted to match one or more types of wrenches. According to further embodiments, the bolt head 194 is attached to the upper end of the shaft 186 to allow it to be more easily accessible by an operator. According to additional embodiments, the top cover 138 and/or the bottom cover 140 are recessed along the periphery of the holes 142 so that the bolt head 194 and the screw buckle 196 do not protrude from the overall profile of the housing 130.

According to some embodiments, the housing 130 has a hollow column 144 extending inwardly from each of the top cover 138 and/or the bottom cover 140. Each of the hollow columns 144 is aligned with the vertical axis 174 and configured to receive the shaft 186. According to some embodiments, the hollow columns 144 provide structure support to the housing 130. According to some embodiments, the height of each hollow column 144 is configured so that the hollow columns 144 function as stopping members for retaining the sliding member 168 between the upper position 170 and the lower position 172.

Figure 3A:
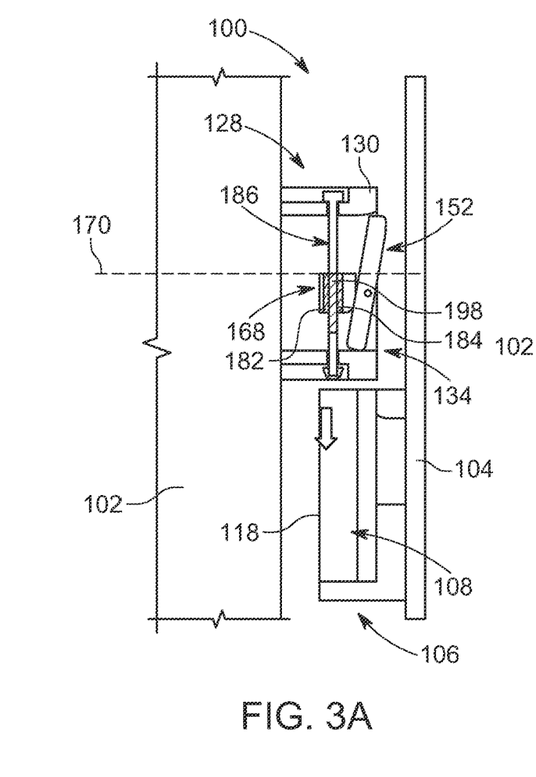
FIG. 3A is a side cross-sectional view of the bracket assembly of FIG. 1 showing the male bracket being aligned with the female bracket, according to certain aspects of the present disclosure.
Figure 3B:
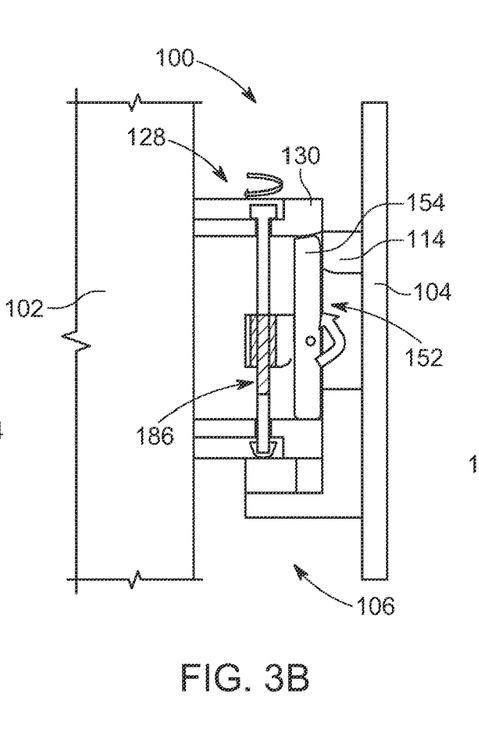
FIG. 3B is a side cross-sectional views of the bracket assembly of FIG. 1 showing the male bracket being inserted into the female bracket, according to certain aspects of the present disclosure.
Figure 3C:
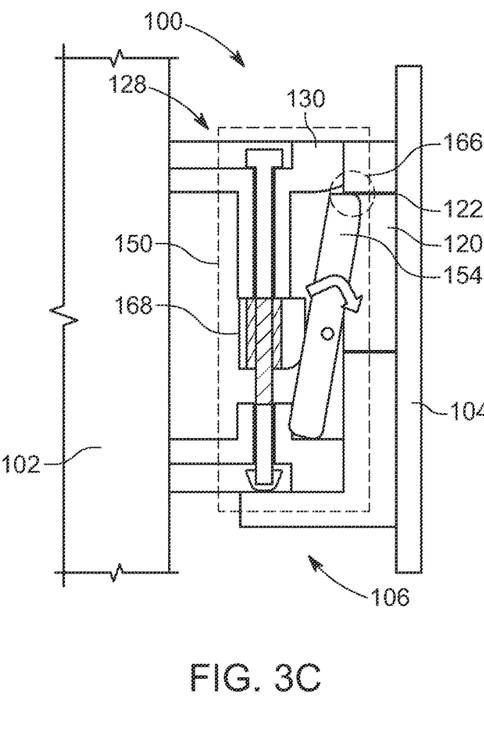
FIG. 3C are side cross-sectional views of the bracket assembly of FIG. 1 showing the male bracket being locked to the female bracket, according to certain aspects of the present disclosure.

Referring to FIGS. 3A to 3C in general, side cross-sectional views of the bracket assembly 100 are shown to illustrate the steps for installing the male bracket 128 to the female bracket 106. Referring specifically to FIG. 3A, the male bracket 128 is positioned to face the female bracket 106 with the housing 130 of the male bracket 128 aligned with the receptacle 108 of the female bracket 106. Specifically, the unwalled or partially walled fourth side 118 of the female bracket 106 is aligned to receive the third side 134 of the male bracket 128. According to some embodiments, the shaft 186 is rotated in a first direction until the sliding member 168 of the male bracket 128 is in the upper position 170 so that the latching member 152 is able to freely rotate. As described above, the sliding member 168 has a bore hole 182 with a threaded interior surface 184. The bore hole 182 is installed around a threaded midsection 198 of the shaft 186. Rotation of the shaft 186 turns the threaded midsection 198 of the shaft 186 inside the bore hole 182 of the sliding member 168, causing the sliding member 168 to move between the upper position 170 and the lower position 172 depending on the direction that the shaft 186 is rotated.

Referring now to FIG. 3B, the male bracket 128 is inserted into the receptacle 108. As the male bracket 128 is inserted into the receptacle 108, the first end 154 of the latching member 152 strikes the backwall 114 of the receptacle 108, which causes the latching member 152 to rotate vertically. Referring to FIG. 3C, when the male bracket 128 is fully seated in the receptacle 108, the first end 154 of the latching member 152 clears the backwall 114 and is released, whereby allowing the first end 154 to automatically rotate into the recess 120. The first end 154 of the latching member engages the ceiling 122 of the recess 120, thereby locking the male bracket 128 with the female bracket 106. The locking mechanism 150 described above allows an operator to mount equipment to a mounting surface (e.g., a wall or a pole) quickly and easily without or with minimal use of other tools, such as a screwdriver.

Figure 4A:
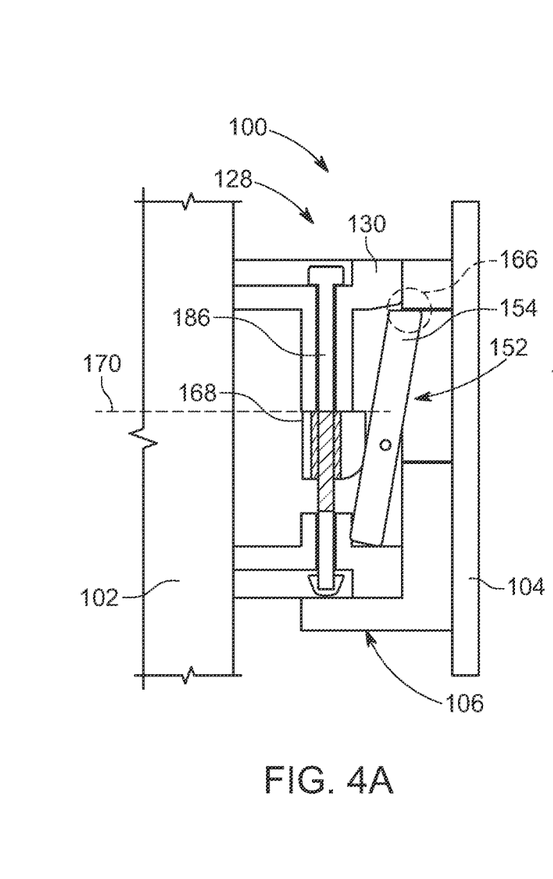
FIG. 4A is a side cross-sectional view of the bracket assembly of FIG. 1 showing a male bracket initially locked to the female bracket, according to certain aspects of the present disclosure.
Figure 4B:
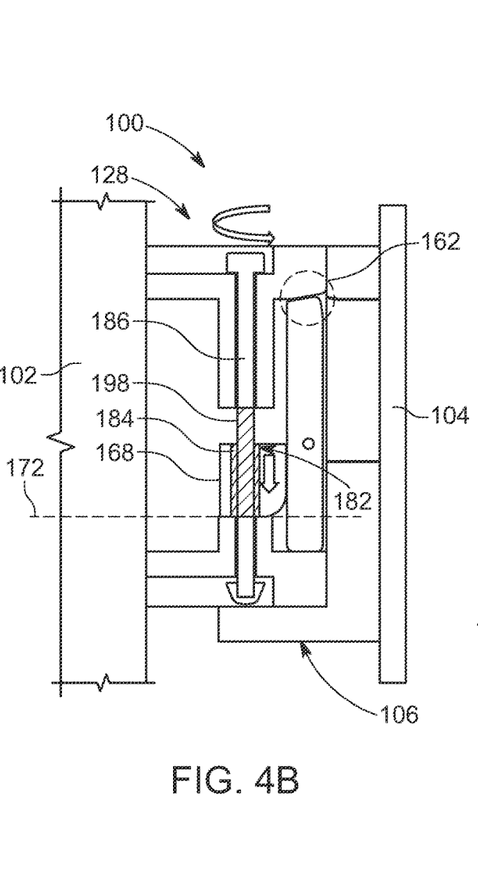
FIG. 4B is a side cross-sectional view of the bracket assembly of FIG. 1 showing the latching member being moved to the unlocked position, according to certain aspects of the present disclosure.
Figure 4C:
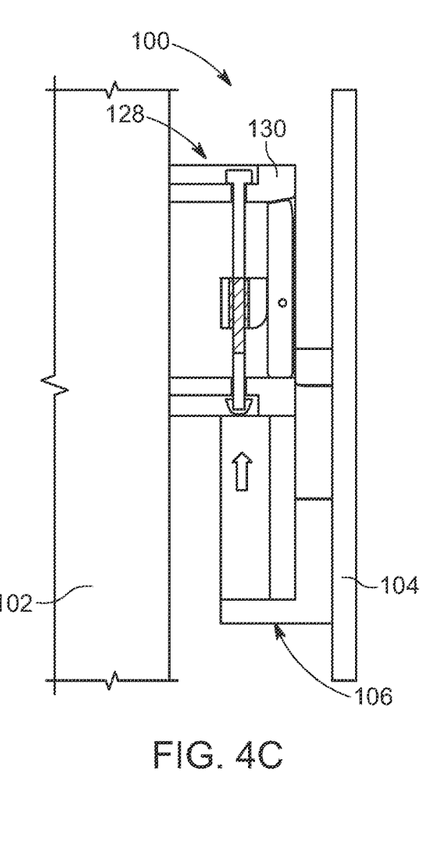
FIG. 4C is a side cross-sectional view of the bracket assembly of FIG. 1 showing the unlocked male bracket being removed from the female bracket, according to certain aspects of the present disclosure.

Referring to FIGS. 4A to 4C in general, the side cross-sectional views of the bracket assembly 100 illustrate the steps for removing the male bracket 128 from the female bracket 106. Referring specifically to FIG. 4A, the male bracket 128 starts fully seated in the receptacle 108 of the female bracket 106. Initially, the sliding member 168 is in the upper position 170 and the first end 154 of the latching member 152 is rotated to the locked position 166. To remove the male bracket 128 from the receptacle 108, the shaft 186 is turned until the sliding member 168 is moved to the lower position 172 as shown in FIG. 4B. Specifically, the shaft 186 is turned in a second direction opposite to the first direction. Turning the shaft 186 causes the threaded midsection 198 of the shaft 186 to engage the threaded interior surface 184 of the bore hole 182 of the sliding member 168, which in turn causes the sliding member 168 to move to the lower position 172. The sliding member 168 presses the second end 156 of the latching member 152 to cause the first end 154 of the latching member 152 rotate to the unlocked position 164. Referring now to FIG. 4C, with the male bracket 128 unlocked from the female bracket 106, the male bracket 128 may be lifted from the receptacle 108.

Figure 5:
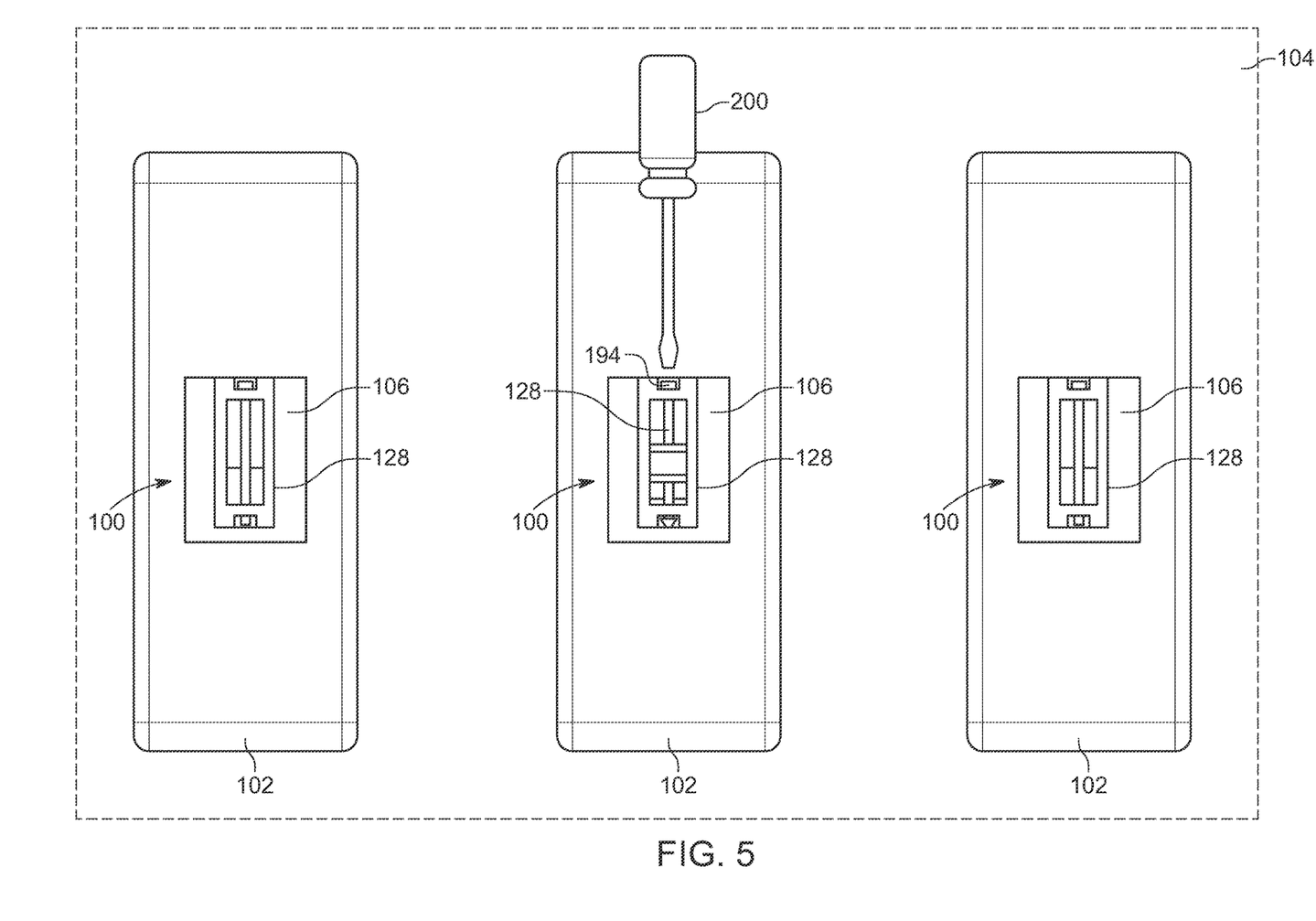
FIG. 5 is a frontal view of multiple equipment fixed to a mounting surface side-by-side using a type of bracket assembly according to certain aspects of the present disclosure.

FIG. 5 illustrates a frontal view of multiple equipment 102 mounted side-by-side to a mounting surface 104 using the exemplary bracket assembly 100 shown in FIGS. 1 to 4C. The disclosed bracket assembly 100 can be unlocked by using a tool, such as a screwdriver 200. According to some embodiments, the screwdriver 200 can be inserted from the top to turn the bolt head 194 and the shaft 186 until the male bracket 128 is unlocked from the female bracket 106. By enabling one to install a piece of equipment vertically, one of the advantages of the disclosed bracket assembly 100 is that equipment can be installed in confined spaces where there is limited operating space on the sides or where multiple pieces of equipment 102 are installed side-by-side and in close proximity to one another. Additionally, as previously mentioned, the disclosed bracket assembly 100 has an automatic locking mechanism which allows a piece of equipment 102 to be quickly and easily installed to a mounting surface 104 with minimal or without use of any tools. The disclosed bracket assembly also allows an operator to easily uninstall the piece of equipment 102 from the mounting surface 104 by using a tool from a more easily accessible angle.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A male bracket for engaging a female bracket including a receptacle and a recess, the receptacle having a base and a plurality of walls extending from the base and the recess being defined on an interior surface of a backwall of the plurality of walls of the female bracket, the male bracket comprising:
- a housing adapted to at least partially fit in the receptacle, the housing having a plurality of walls defining a cavity; and
- a locking mechanism including:
  - a latching member pivotably fixed in the cavity to rotate about a pivot axis, the latching member having a first end and a second end distally located from the first end, the first end being pivotable between an unlocked position where the first end retracts inside the housing and a locked position where the first end protrudes from the housing and rests in the recess of the female bracket, the latching member rotating to the locked position in response to gravity;
  - a sliding member movable along a vertical axis between an upper position and a lower position, the sliding member having a first surface configured to press against the second end of the latching member when the sliding member is in the lower position to cause the first end of the latching member to pivot into the unlocked position, the latching member being able to freely rotate in the upper position; and
  - a shaft extending along the vertical axis, the shaft being configured to manipulate movement of the sliding member between the upper position and the lower position;
  - wherein the sliding member further includes a bore hole coinciding with the vertical axis, the bore hole having a threaded interior surface installed around a threaded midsection of the shaft whereby rotation of the shaft adjusts position of the sliding member.

2. The male bracket of claim 1, wherein the latching member has a center of mass offset from the pivot axis so that the first end is biased to rotate towards the locked position.

3. The male bracket of claim 1, wherein the shaft further includes a first shaft end having a bolt head attached thereto.

4. The male bracket of claim 1, wherein the sliding member further includes a second surface positioned below the first surface at an angle relative to the first surface, the second surface being configured to interface with the second end of the latching member when the sliding member is in the upper position to retain the first end of the latching member in the locked position, the angle of the second surface of the sliding member relative to the first surface being about 10 degrees to about 20 degrees.

5. The male bracket of claim 1, wherein the housing further including one or more mounting points on an exterior surface of the housing, the one or more mounting points being adapted for attachment to a mounting surface.

6. A bracket assembly for installation of equipment comprising:
- a female bracket including:
  - a receptacle having a base and a plurality of walls extending from the base; and
  - a recess defined on an interior surface of a backwall of the plurality of walls; and
- a male bracket including:
  - a housing adapted to at least partially fit in the receptacle, the housing having a plurality of walls defining a cavity; and
  - a locking mechanism including:
    - a latching member pivotably fixed in the cavity to rotate about a pivot axis, the latching member having a first end and a second end distally located from the first end, the first end being pivotable between an unlocked position where the first end retracts inside the housing and a locked position where the first end protrudes from the housing to engage a ceiling of the recess, the latching member rotating to the locked position in response to gravity;
    - a sliding member movable along a vertical axis between an upper position and a lower position, the sliding member having a first surface configured to press against the second end of the latching member when the sliding member is in the lower position to cause the first end of the latching member pivot into the unlocked position, the latching member being able to freely rotate in the upper position; and
    - a shaft extending along the vertical axis, the shaft being configured to manipulate movement of the sliding member between the upper position and the lower position.

7. The bracket assembly of claim 6, wherein the latching member has a center of mass offset from the pivot axis so that the first end is biased to rotate towards the locked position.

8. The bracket assembly of claim 6, wherein the sliding member further includes a bore hole coinciding with the vertical axis, the bore hole having a threaded interior surface installed around a threaded midsection of the shaft whereby rotation of the shaft adjusts position of the sliding member.

9. The bracket assembly of claim 6, wherein the shaft further includes a first shaft end having a bolt head attached thereto.

10. The male bracket of claim 9, wherein the shaft further includes a second shaft end distal to the first shaft end, the bolt head and a screw buckle capture the shaft between a top cover and a bottom cover of the housing.

11. The bracket assembly of claim 6, wherein the sliding member further includes a second surface positioned below the first surface at an angle relative to the first surface, the second surface being configured to interface with the second end of the latching member when the sliding member is in the upper position to retain the first end of the latching member in the locked position.

12. The bracket assembly of claim 11, wherein the angle of the second surface of the sliding member relative to the first surface is about 10 degrees to about 20 degrees.

13. The bracket assembly of claim 6, wherein the housing further including one or more mounting points on an exterior surface of the housing, the one or more mounting points being adapted for attachment to a mounting surface.

14. The bracket assembly of claim 6, wherein the housing further includes one or more protuberances configured to engage one or more channels in the receptacle of the female bracket to retain the male bracket in the receptacle.

15. A piece of electronic equipment comprising:
- an electronic device having a mounting surface; and
- a male bracket for engaging a female bracket including a receptacle and a recess, the receptacle having a base and a plurality of walls extending from the base and the recess being defined on an interior surface of a backwall of the plurality of walls, the male bracket including:
  - a housing adapted to at least partially fit in the receptacle, the housing having a plurality of walls defining a cavity, an exterior surface of the housing being fixed to the mounting surface of the electronic device; and a locking mechanism including:
  a latching member pivotably fixed in the cavity to rotate about a pivot axis, the latching member having a first end and a second end distally located from the first end, the first end being pivotable between an unlocked position where the first end retracts inside the housing and a locked position where the first end protrudes from the housing to engage a ceiling of the recess, the latching member rotating to the locked position in response to gravity;
  a sliding member movable along a vertical axis between an upper position and a lower position, the sliding member having a first surface configured to press against the second end of the latching member when the sliding member is in the lower position to cause the first end of the latching member to pivot into the unlocked position, the latching member being able to freely rotate in the upper position; and
  a shaft extending along the vertical axis, the shaft being configured to manipulate movement of the sliding member between the upper position and the lower position.

16. A male bracket for engaging a female bracket including a receptacle and a recess, the receptacle having a base and a plurality of walls extending from the base and the recess being defined on an interior surface of a backwall of the plurality of walls of the female bracket, the male bracket comprising:
  a housing adapted to at least partially fit in the receptacle, the housing having a plurality of walls defining a cavity; and
  a locking mechanism including:
    a latching member pivotably fixed in the cavity to rotate about a pivot axis, the latching member having a first end and a second end distally located from the first end, the first end being pivotable between an unlocked position where the first end retracts inside the housing and a locked position where the first end protrudes from the housing and rests in the recess of the female bracket;
    a sliding member movable along a vertical axis between an upper position and a lower position, the sliding member having
      a first surface configured to press against the second end of the latching member when the sliding member is in the lower position to cause the first end of the latching member to pivot into the unlocked position, and
      a second surface positioned below the first surface at an angle relative to the first surface, the second surface being configured to interface with the second end of the latching member when the sliding member is in the upper position to retain the first end of the latching member in the locked position; and
    a shaft extending along the vertical axis, the shaft being configured to manipulate movement of the sliding member between the upper position and the lower position.

17. The male bracket of claim 16, wherein the angle of the second surface of the sliding member relative to the first surface is about 10 degrees to about 20 degrees.

18. A male bracket for engaging a female bracket including a receptacle and a recess, the receptacle having a base and a plurality of walls extending from the base and the recess being defined on an interior surface of a backwall of the plurality of walls of the female bracket, the male bracket comprising:
  a housing adapted to at least partially fit in the receptacle, the housing having a plurality of walls defining a cavity; and
  a locking mechanism including:
    a latching member pivotably fixed in the cavity to rotate about a pivot axis, the latching member having a first end and a second end distally located from the first end, the first end being pivotable between an unlocked position where the first end retracts inside the housing and a locked position where the first end protrudes from the housing and rests in the recess of the female bracket, the latching member rotating to the locked position in response to gravity;
    a sliding member movable along a vertical axis between an upper position and a lower position, the sliding member having a first surface configured to press against the second end of the latching member when the sliding member is in the lower position to cause the first end of the latching member to pivot into the unlocked position, the latching member being able to freely rotate in the upper position; and
    a shaft extending along the vertical axis, the shaft being configured to manipulate movement of the sliding member between the upper position and the lower position;
  wherein the shaft further includes a first shaft end having a bolt head attached thereto, the shaft further including a second shaft end distal to the first shaft end, the bolt head and a screw buckle capture the shaft between a top cover and a bottom cover of the housing.

19. A male bracket for engaging a female bracket including a receptacle and a recess, the receptacle having a base and a plurality of walls extending from the base and the recess being defined on an interior surface of a backwall of the plurality of walls of the female bracket, the male bracket comprising:
  a housing adapted to at least partially fit in the receptacle, the housing having a plurality of walls defining a cavity; and
  a locking mechanism including:
    a latching member pivotably fixed in the cavity to rotate about a pivot axis, the latching member having a first end and a second end distally located from the first end, the first end being pivotable between an unlocked position where the first end retracts inside the housing and a locked position where the first end protrudes from the housing and rests in the recess of the female bracket, the latching member rotating to the locked position in response to gravity;
    a sliding member movable along a vertical axis between an upper position and a lower position, the sliding member having a first surface configured to press against the second end of the latching member when the sliding member is in the lower position to cause the first end of the latching member to pivot into the unlocked position, the latching member being able to freely rotate in the upper position; and
    a shaft extending along the vertical axis, the shaft being configured to manipulate movement of the sliding member between the upper position and the lower position;
  wherein the sliding member further includes a second surface positioned below the first surface at an angle relative to the first surface, the second surface being configured to interface with the second end of the latching member when the sliding member is in the upper position to retain the first end of the latching member in the locked position.

20. A male bracket for engaging a female bracket including a receptacle and a recess, the receptacle having a base and a plurality of walls extending from the base and the recess being defined on an interior surface of a backwall of the plurality of walls of the female bracket, the male bracket comprising:
  a housing adapted to at least partially fit in the receptacle, the housing having a plurality of walls defining a cavity; and
  a locking mechanism including:
    a latching member pivotably fixed in the cavity to rotate about a pivot axis, the latching member having a first end and a second end distally located from the first end, the first end being pivotable between an unlocked position where the first end retracts inside the housing and a locked position where the first end protrudes from the housing and rests in the recess of the female bracket, the latching member rotating to the locked position in response to gravity;
    a sliding member movable along a vertical axis between an upper position and a lower position, the sliding member having a first surface configured to press against the second end of the latching member when the sliding member is in the lower position to cause the first end of the latching member to pivot into the unlocked position, the latching member being able to freely rotate in the upper position; and
    a shaft extending along the vertical axis, the shaft being configured to manipulate movement of the sliding member between the upper position and the lower position;
  wherein the latching member is an elongated member having a pin traversing a midsection of the elongated member along the pivot axis, the midsection being situated between the first end and the second end of the latching member.

21. A male bracket for engaging a female bracket including a receptacle and a recess, the receptacle having a base and a plurality of walls extending from the base and the recess being defined on an interior surface of a backwall of the plurality of walls of the female bracket, the male bracket comprising:
  a housing adapted to at least partially fit in the receptacle, the housing having a plurality of walls defining a cavity; and
  a locking mechanism including:
    a latching member pivotably fixed in the cavity to rotate about a pivot axis, the latching member having a first end and a second end distally located from the first end, the first end being pivotable between an unlocked position where the first end retracts inside the housing and a locked position where the first end protrudes from the housing and rests in the recess of the female bracket, the latching member rotating to the locked position in response to gravity;
    a sliding member movable along a vertical axis between an upper position and a lower position, the sliding member having a first surface configured to press against the second end of the latching member when the sliding member is in the lower position to cause the first end of the latching member to pivot into the unlocked position, the latching member being able to freely rotate in the upper position; and
    a shaft extending along the vertical axis, the shaft being configured to manipulate movement of the sliding member between the upper position and the lower position;
  wherein the housing further includes one or more protuberances configured to engage one or more channels in the receptacle of the female bracket to retain the male bracket in the receptacle.

* * * * *